United States Patent
Chang et al.

(10) Patent No.: US 12,205,648 B2
(45) Date of Patent: Jan. 21, 2025

(54) THREE-DIMENSIONAL ONE TIME PROGRAMMABLE MEMORY

(71) Applicant: Taiwan Semiconductor Manufacturing Company, Ltd., Hsinchu (TW)

(72) Inventors: Meng-Sheng Chang, Chu-bei (TW); Chia-En Huang, Xinfeng Township (TW); Yi-Ching Liu, Hsinchu (TW); Yih Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 178 days.

(21) Appl. No.: 17/461,278

(22) Filed: Aug. 30, 2021

(65) Prior Publication Data
US 2023/0061700 A1    Mar. 2, 2023

(51) Int. Cl.
| | | |
|---|---|---|
| G11C 7/22 | (2006.01) |
| G11C 16/04 | (2006.01) |
| G11C 16/10 | (2006.01) |
| G11C 16/24 | (2006.01) |
| G11C 16/26 | (2006.01) |
| G11C 16/34 | (2006.01) |

(52) U.S. Cl.
CPC ........ *G11C 16/102* (2013.01); *G11C 16/0433* (2013.01); *G11C 16/24* (2013.01); *G11C 16/26* (2013.01); *G11C 16/3404* (2013.01)

(58) Field of Classification Search
CPC ... G11C 16/102; G11C 16/0433; G11C 16/24; G11C 16/26; G11C 16/3404; G11C 17/18; G11C 17/165
USPC .................................................. 365/189.011
See application file for complete search history.

(56) References Cited

U.S. PATENT DOCUMENTS

| | | | | |
|---|---|---|---|---|
| 9,570,192 | B1 * | 2/2017 | Yoon | G11C 8/14 |
| 9,852,805 | B2 * | 12/2017 | Luan | G11C 17/16 |
| 9,865,609 | B2 * | 1/2018 | Chen | G11C 17/08 |
| 10,090,059 | B2 * | 10/2018 | Kim | G11C 17/18 |
| 10,217,521 | B2 * | 2/2019 | Omid-Zohoor | H10B 43/27 |
| 2018/0019018 | A1 * | 1/2018 | Omid-Zohoor | G11C 17/16 |
| 2020/0058660 | A1 * | 2/2020 | Chang | H10B 20/20 |
| 2020/0219570 | A1 * | 7/2020 | Ha | G11C 29/24 |

\* cited by examiner

*Primary Examiner* — Tha-O H Bui
(74) *Attorney, Agent, or Firm* — FOLEY & LARDNER LLP (57) ABSTRACT

Disclosed herein are related to a memory array including one-time programmable (OTP) cells. In one aspect, the memory array includes a set of OTP cells including a first subset of OTP cells connected between a first program control line and a first read control line. Each OTP cell of the first subset of OTP cells may include a programmable storage device and a switch connected between the first program control line and the first read control line. The first program control line may extend towards a first side of the memory array along a first direction, and the first read control line may extend towards a second side of the memory array facing away from the first side of the memory array.

20 Claims, 9 Drawing Sheets

FIG. 8

THREE-DIMENSIONAL ONE TIME PROGRAMMABLE MEMORY

BACKGROUND

Developments in electronic devices, such as computers, portable devices, smart phones, internet of thing (IoT) devices, etc., have prompted increased demands for memory devices. In general, memory devices may be volatile memory devices and non-volatile memory devices. Volatile memory devices can store data while power is provided but may lose the stored data once the power is shut off. Unlike volatile memory devices, non-volatile memory devices may retain data even after the power is shut off but may be slower than the volatile memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a memory system includes a three-dimensional memory array of OTP cells. An OTP cell may include a programmable storage device and a switch. The programmable storage device may be embodied as a non-volatile memory device (e.g., a flash memory device, resistive random access memory (ReRAM), magnetoresistive random-access memory (MRAM), phase change random access memory (PCRAM), etc.). In one example, a high voltage can be applied to the programmable storage device of the OTP cell, such that oxide break down may occur. Such oxide break down may cause change in a resistance of the programmable storage device of the OTP cell. By applying a high voltage to programmable storage devices of selected OTP cells, programmable storage devices in different OTP cells can have varying resistances corresponding to data.

In one aspect, the OTP cells are disposed in a three-dimensional array. The memory array may include multiple sets of OTP cells. Each set of OTP cells may include subsets of OTP cells, each connected between a corresponding program control line and a corresponding read control line. The program control line may extend towards a first side of the memory array along a first direction, and the read control line may extend towards a second side of the memory array facing away from the first side of the memory array. In one configuration, program control lines of a subset of OTP cells are connected to a global program control line. In one configuration, read control lines of a subset of OTP cells are connected to a global read control line. In one configuration, OTP cells in different sets are connected through corresponding bit lines. Accordingly, OTP cells can be arranged in a three-dimensional array to improve storage density.

Figure 1:
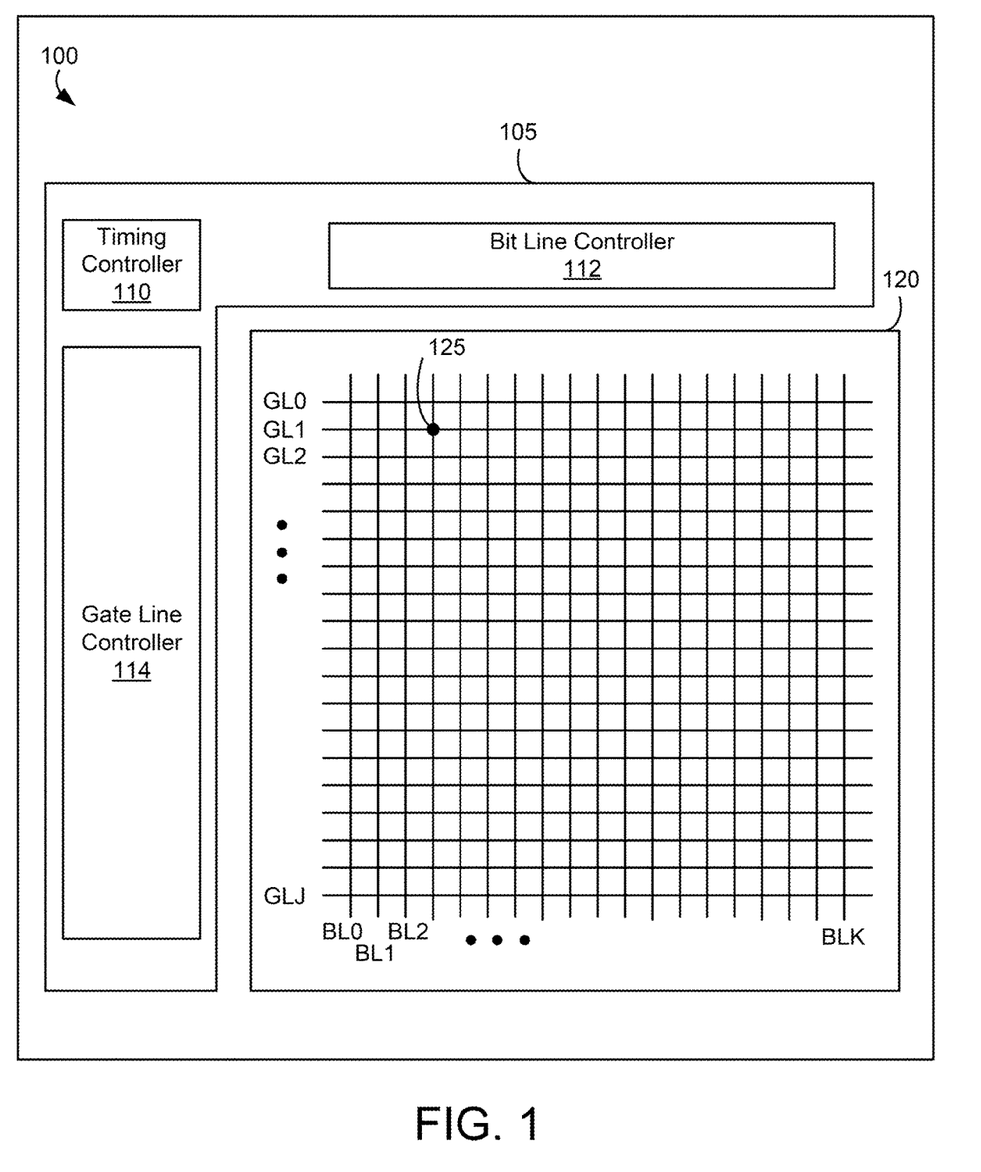
FIG. 1 is a diagram of a memory system, in accordance with one embodiment.

FIG. 1 is a diagram of a memory system 100, in accordance with one embodiment. In some embodiments, the memory system 100 is implemented as an integrated circuit. In some embodiments, the memory system 100 includes a memory controller 105 and a memory array 120. The memory array 120 may include a plurality of OTP cells 125 (or memory cells 125) arranged in two- or three-dimensional arrays. Each OTP cell 125 may be connected to a corresponding gate line GL and a corresponding bit line BL. Each gate line GL may include any conductive material. The memory controller 105 may write data to or read data from the memory array 120 according to electrical signals through gate lines GL and bit lines BL. In other embodiments, the memory system 100 includes more, fewer, or different components than shown in FIG. 1.

The memory array 120 is a hardware component that stores data. In one aspect, the memory array 120 is embodied as a semiconductor memory device. The memory array 120 includes a plurality of storage circuits or OTP cells 125. In some embodiments, the memory array 120 includes gate lines GL0, GL1 . . . GLJ, each extending in a first direction and bit lines BL0, BL1 . . . BLK, each extending in a second direction. The gate lines GL and the bit lines BL may be conductive metals or conductive rails. Each gate line GL may include a word line or a control line (e.g., program control line, read control line). In one aspect, each OTP cell 125 is connected to a corresponding gate line GL and a corresponding bit line BL, and can be operated according to voltages or currents through the corresponding gate line GL and the corresponding bit line BL. In some embodiments, the memory array 120 includes additional lines (e.g., select lines, reference lines, reference control lines, power rails, etc.).

The memory controller 105 is a hardware component that controls operations of the memory array 120. In some embodiments, the memory controller 105 includes a bit line controller 112, a gate line controller 114, and a timing controller 110. In one configuration, the gate line controller 114 is a circuit that provides a voltage or a current through one or more gate lines GL of the memory array 120. In one aspect, the bit line controller 112 is a circuit that provides a voltage or current through one or more bit lines BL of the memory array 120 and senses a voltage or current from the memory array 120 through one or more bit lines BL. In one configuration, the timing controller 110 is a circuit that provides control signals or clock signals to the gate line controller 114 and the bit line controller 112 to synchronize operations of the bit line controller 112 and the gate line controller 114. The bit line controller 112 may be connected to bit lines BL of the memory array 120, and the gate line controller 114 may be connected to gate lines GL of the memory array 120. In one example, to write data to an OTP cell 125, the gate line controller 114 applies a voltage or current to the OTP cell 125 through a gate line GL connected to the OTP cell 125, and the bit line controller 112 applies a voltage or current corresponding to data to be stored to the OTP cell 125 through a bit line BL connected to the OTP cell 125. In one example, to read data from an OTP cell 125, the gate line controller 114 applies a voltage or a current to the OTP cell 125 through a gate line GL connected to the OTP cell 125, and the bit line controller 112 senses a voltage or current corresponding to data stored by the OTP cell 125 through a bit line BL connected to the OTP cell 125. In some embodiments, the memory controller 105 includes more, fewer, or different components than shown in FIG. 1.

Figure 2:
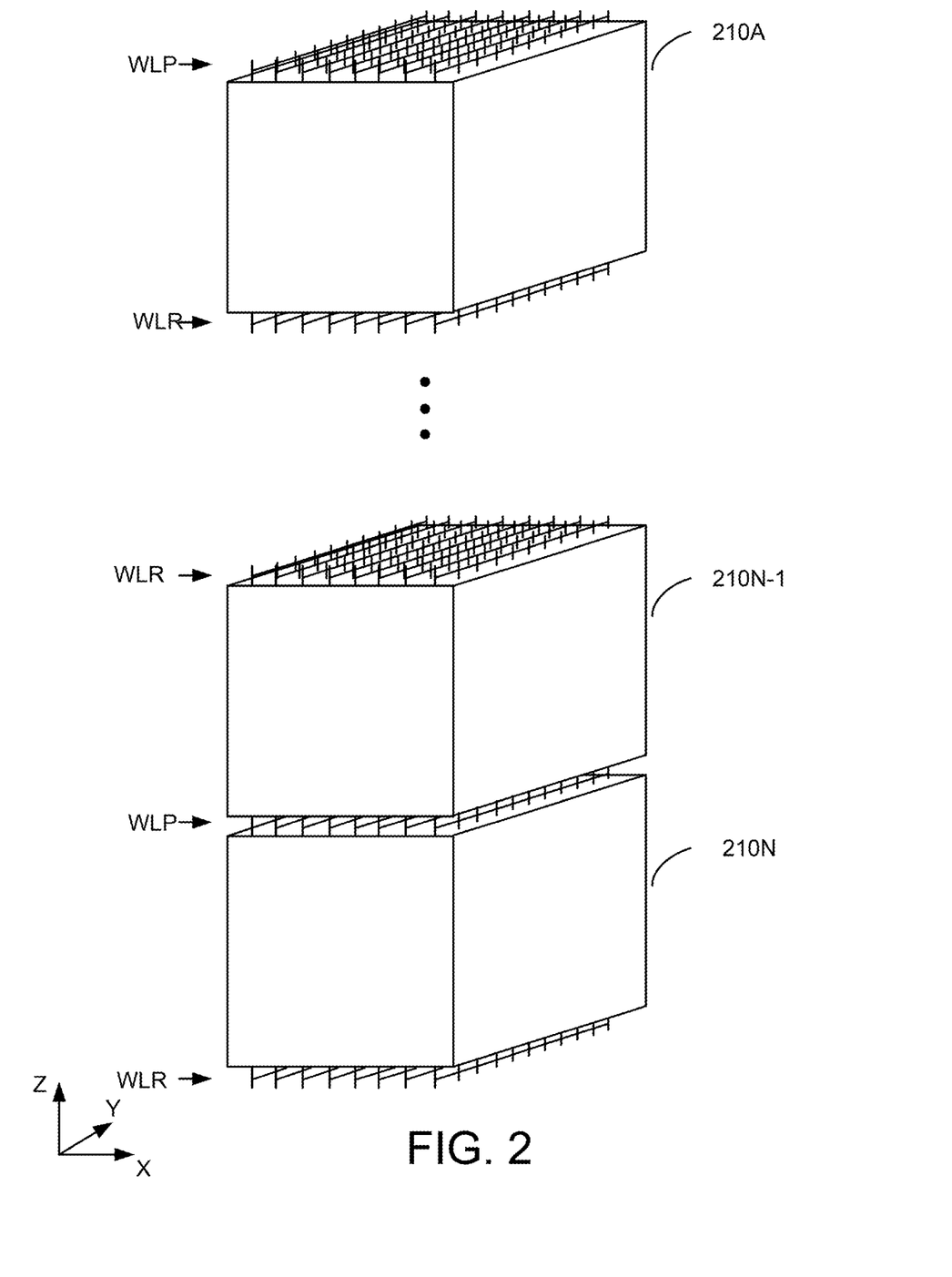
FIG. 2 is a diagram showing three-dimensional memory arrays, in accordance with one embodiment.

FIG. 2 is a diagram showing three-dimensional memory arrays 210A . . . 210N, in accordance with one embodiment. In some embodiments, the memory array 120 includes the memory arrays 210A . . . 210N. Each memory array 210 includes a plurality of OTP cells 125 arranged in a three-dimensional array. In some embodiments, each memory array 210 may include a same number of OTP cells 125. In some embodiments, two or more memory arrays 210 may include different numbers of OTP cells 125. In one configuration, the memory arrays 210A . . . 210N are stacked along a Z-direction. Each memory array 210 may have program control lines WLP on one side of the memory array 210 and have read control lines WLR on an opposite side of the memory array 210. In some embodiments, two adjacent memory arrays 210 may share read control lines WLR. In some embodiments, two adjacent memory arrays 210 may share program control lines WLP. For example, memory arrays 210N-2, 210N-1 share or are electrically coupled to a set of read control lines WLR. For example, memory arrays 210N-1, 210N share or are electrically coupled to a set of program control lines WLP. By sharing read control lines WLR and/or program control lines WLP, a number of drivers of the memory controller 105 to apply signals through the read control lines WLR and/or program control lines WLP can be reduced to achieve area efficiency. In some embodiments, the memory array 120 includes additional memory arrays that may have separate read control lines WLR and/or program control lines WLP than shown in FIG. 2.

Figure 3:
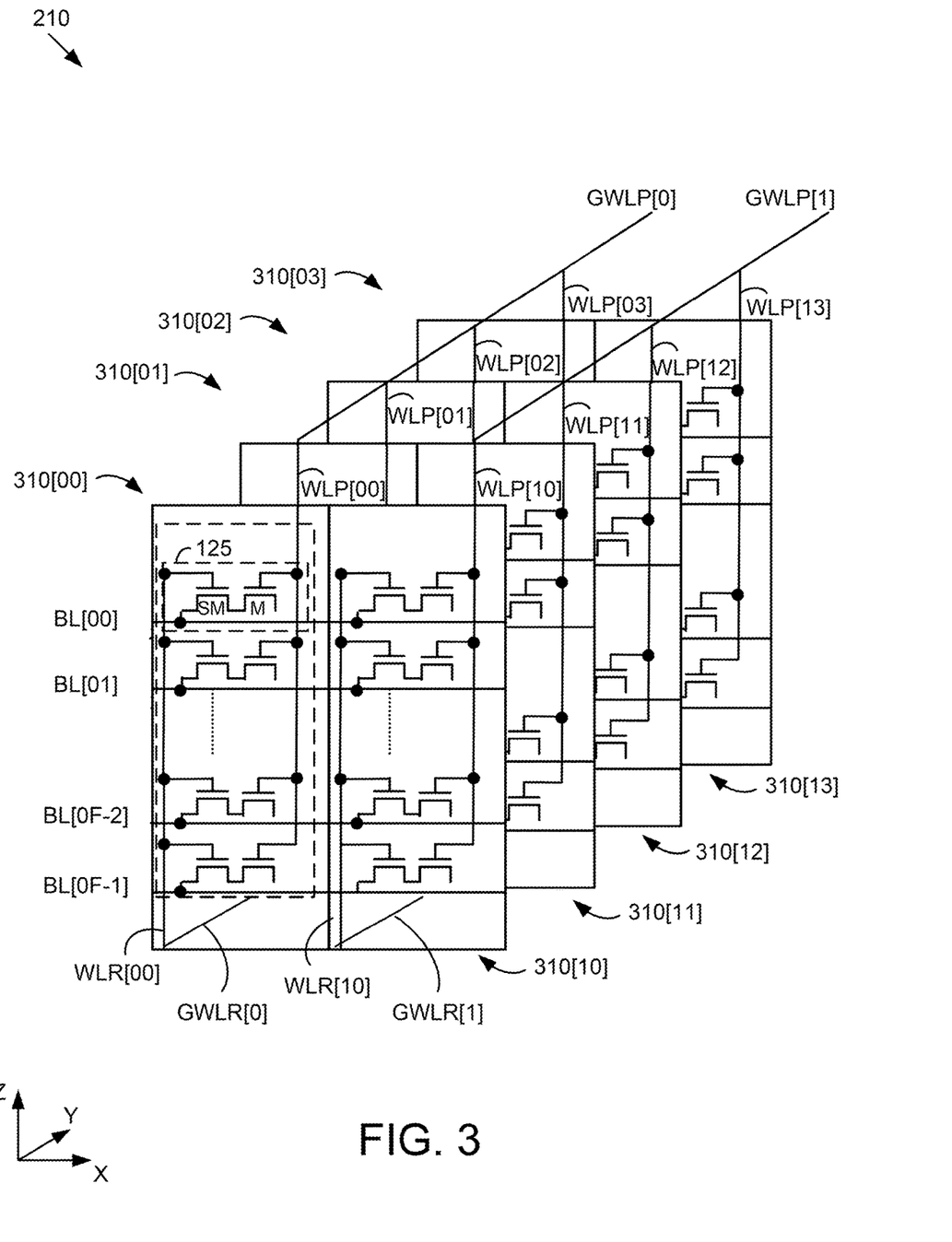
FIG. 3 is a diagram showing a portion of a three-dimensional memory array including one-time programmable (OTP) cells, in accordance with one embodiment.

FIG. 3 is a diagram showing a portion of a three-dimensional memory array 210 including OTP cells 125, in accordance with one embodiment. In FIG. 3, the memory array 210 includes a first set of OTP cells and a second set of OTP cells. In one configuration, the first set of OTP cells includes subsets 310[00] . . . 310[03] of OTP cells that may be electrically coupled to a global program control line GWLP[0] and a global read control line GWLR[0] extending along a Y-direction. In one configuration, the second set of OTP cells includes subsets 310[10] . . . 310[13] of OTP cells that may be electrically coupled to a global program control line GWLP[1] and a global read control line GWLR[1] extending along the Y-direction. The global program control lines GWLP and the global read control lines GWLR may be connected to the memory controller 105 (e.g., gate line controller 114). By connecting OTP cells through the global program control lines GWLP and the global read control lines GWLR rather than a large number of local program control lines WLP and local read control lines WLR, routings or connections between the memory controller 105 and the memory array 210 can be simplified. In some embodiments, each subset 310 of OTP cells may include F number of OTP cells 125 disposed along a Z-direction. Each set of OTP cells may include a larger number of subsets 310 of OTP cells than shown in FIG. 3 along the Y-direction. The memory array 210 may include a larger number of sets of OTP cells than shown in FIG. 3 stacked along the X-direction. By arranging OTP cells 125 as shown in FIG. 3, a storage density of the memory array 210 can be increased.

In one configuration, each subset 310 of OTP cells includes F number of OTP cells 125 disposed along the Z-direction. Each OTP cell 125 may include one or more switches SM and a programmable storage device M coupled between a local program control line WLP and a local read control line WLR. Each switch SM may be embodied as a transistor (e.g., MOSFET, GAAFET, FinFET, etc.). Each switch SM may be an N-type transistor or a P-type transistor. Each programmable storage device M may be embodied as a non-volatile memory device (e.g., a flash memory device, resistive random access memory (ReRAM), magnetoresistive random-access memory (MRAM), phase change random access memory (PCRAM), etc.). Each programmable storage device M may be embodied as a floating transistor (e.g., MOSFET, GAAFET, FinFET, etc.) including a floating electrode. The switch SM and the programmable storage device M may be embodied as a same type of transistors or different types of transistors.

In one configuration, each switch SM may include a first electrode (e.g., source electrode) coupled to a corresponding bit line BL, a second electrode (e.g., drain electrode) coupled to a first electrode (e.g., source electrode) of the programmable storage device M, and a third electrode (e.g., gate electrode) coupled to a corresponding local read control line WLR. Each programmable storage device M may include the first electrode (e.g., source electrode) coupled to the second electrode (e.g., drain electrode) of the corresponding switch SM, a second electrode (e.g., gate electrode) coupled to a corresponding program control line WLP, and a third electrode (e.g., drain electrode). The third electrode of the programmable storage device M may be floated or omitted. A bit line BL may extend along the X-direction to connect source electrodes of corresponding switches SM in different sets to the memory controller 105 (e.g., bit line controller 112). In one aspect, the switch SM is enabled, in response to an on-voltage (e.g., logic '1') applied to the local read control line WLR to electrically couple the bit line BL to the programmable storage device M. In one aspect, the switch SM is disabled, in response to an off-voltage (e.g., logic '0') applied to the local read control line WLR to electrically decouple the bit line BL from the programmable storage device M.

In one configuration, a subset 310 of OTP cells 125 is connected in parallel between a local read control line WLR and a local program control line WLP. A local read control line WLR may be a metal rail, at which gate electrodes of the switches SM are connected. A local program control line WLP may be a metal rail, at which gate electrodes of the programmable storage devices M are connected. The local program control line WLP may extend along the Z-direction towards a first side (e.g., top side) of the memory array 210 and connect to a global program control line GWLP extending along the Y-direction. Similarly, the local read control line WLR may extend along an opposite direction of the Z-direction towards a second side (e.g., bottom side) of the memory array 210 facing away from the first side and connect to a global read control line GWLR extending along the Y-direction.

In one aspect, the memory controller 105 may program OTP cells 125 by applying voltages or current through global program control lines GWLP, global read control lines GWLR, and bit lines BL. To program an OTP cell 125 to have a first state, the memory controller 105 may apply a first voltage (e.g., 10V) to the global program control line GWLP coupled to the OTP cell 125, a second voltage (or the on-voltage) corresponding to logic '1' to a global read control line GWLR coupled to the switch SM, and a third voltage (e.g., ground voltage) to a bit line BL. By applying the second voltage corresponding to logic '1' to the global read control line GWLR, the switch SM can be enabled such that the third voltage can be applied to the source electrode of the programmable storage device M through the bit line BL. Meanwhile, the first voltage can be applied to the gate electrode of the programmable storage device M. Due to the first voltage applied to the gate electrode of the programmable storage device M and the third voltage applied to the source electrode of the programmable storage device M, oxide break down may occur. Such oxide break down may cause change in a resistance of the programmable storage device M. Thus, OTP cells 125 applied with the first voltage, the second voltage, and the third voltage may have a first resistance corresponding to the first state, where OTP cells 125 not applied with the first voltage, the second voltage, and the third voltage may have a second resistance corresponding to the second state.

In one aspect, the memory controller 105 may read data stored by the OTP cells 125 by applying voltages or current through global program control lines GWLP, and global read control lines GWLR. In one approach, the memory controller 105 may read data stored by a subset 310 of memory cells by applying a first read voltage (e.g., 1V) to the global program control line GWLP and the second voltage (or the on-voltage) to the global read control line GWLR. By applying the second voltage corresponding to logic '1' to the global read control line GWLR, the switch SM can be enabled and current corresponding to the programmed state or a resistance of the programmable storage device M can flow through the bit line BL. By sensing current through the bit line BL, the memory controller 105 (or the bit line controller 112) may determine the programmed state of the programmable storage device M. In one aspect, the subset 310 of OTP cells can store multi-level data according to parallel resistances of the programmable storage devices M in the subset 310. For example, the memory controller 105 may determine that OTP cell 125 stores a first state in response to the sensed current being above a predetermined threshold current. For example, the memory controller 105 may determine that OTP cell 125 stores a second state in response to the sensed current being below the predetermined threshold current.

Figure 4A:
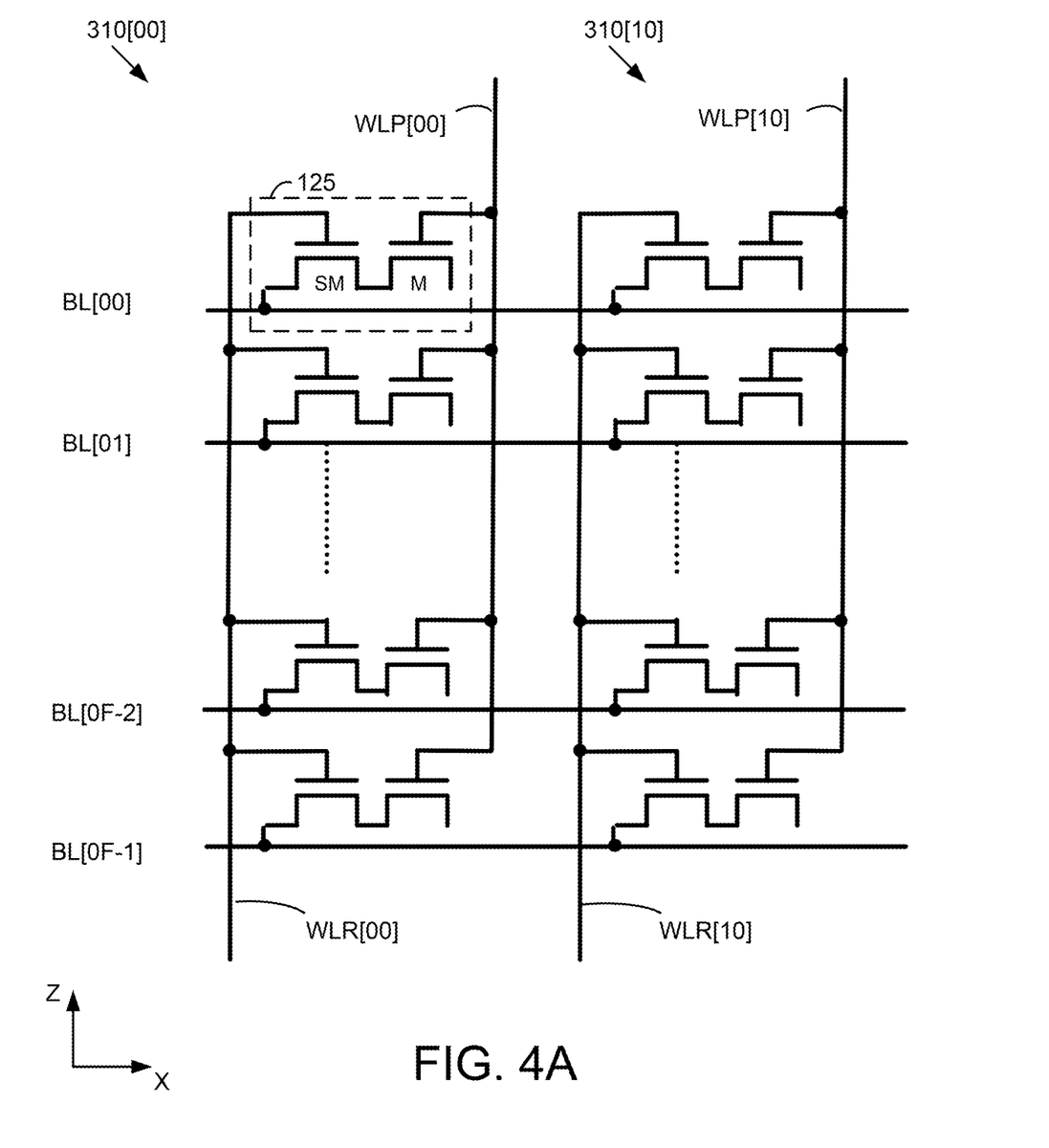
FIG. 4A is a diagram showing OTP cells, in accordance with one embodiment.

FIG. 4A is a diagram showing a subset 310[00] of OTP cells and a subset 310[10] of OTP cells, in accordance with one embodiment. As described above with respect to FIG. 3, gate electrodes of programmable storage devices M of the subset 310[00] are connected to a local program control line WLP[00] extending along the Z-direction towards a first side (e.g., top side) of the memory array 210, and gate electrodes of switches SM of the subset 310[00] are connected to a local read control line WLR[00] extending along an opposite direction of the Z-direction towards a second side (e.g., bottom side) of the memory array 210. Similarly, gate electrodes of programmable storage devices M of the subset 310[10] are connected to a local program control line WLP[10] extending along the Z-direction towards the first side of the memory array 210, and gate electrodes of switches SM of the subset 310[10] are connected to a local read control line WLR[10] extending along the opposite direction of the Z-direction towards the second side of the memory array 210. Source electrodes of the switches SM in the subset 310[00] may be electrically coupled to source electrodes of the switches SM in the subset 310[10] through respective bit lines BL extending along the X-direction. Accordingly, the OTP cells 125 may be arranged in NOR configuration.

Figure 4B:
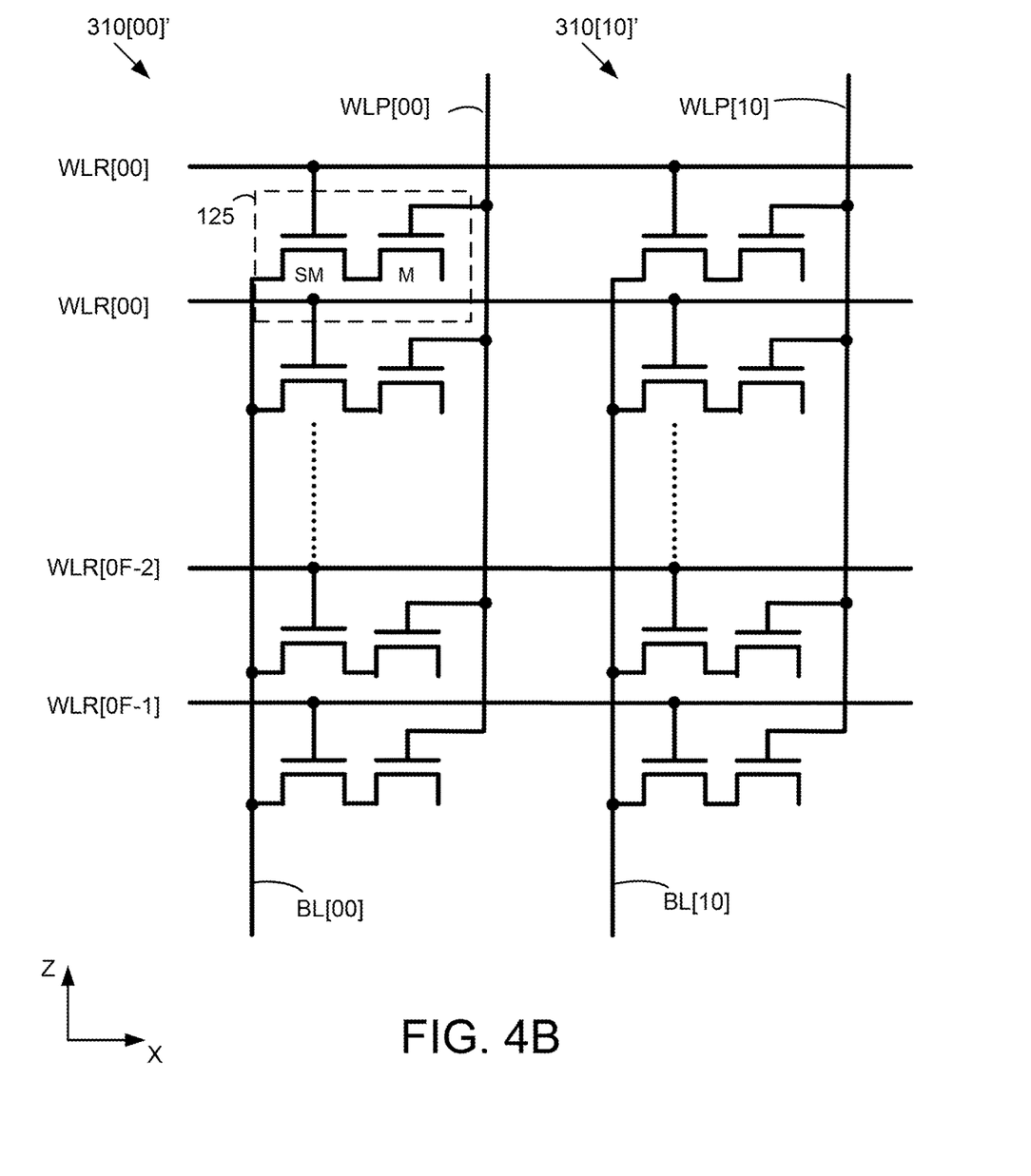
FIG. 4B is a diagram showing OTP cells, in accordance with one embodiment.

FIG. 4B is a diagram showing a subset 310[00]' of OTP cells and a subset 310[10]' of OTP cells, in accordance with one embodiment. In one configuration, gate electrodes of programmable storage devices M of the subset 310[00]' are connected to a local program control line WLP[00] extending along the Z-direction towards a first side (e.g., top side) of the memory array 210, and source electrodes of switches SM of the subset 310[00]' are connected to a local bit line BL[00] extending along an opposite direction of the Z-direction towards a second side (e.g., bottom side) of the memory array 210. Similarly, gate electrodes of programmable storage devices M of the subset 310[10]' are connected to a local program control line WLP[10] extending along the Z-direction towards the first side of the memory array 210, and source electrodes of switches SM of the subset 310[10]' are connected to a local bit line BL[10] extending along the opposite direction of the Z-direction towards the second side of the memory array 210. Gate electrodes of the switches SM in the subset 310[00]' may be electrically coupled to gate electrodes of the switches SM in the subset 310[10]' through respective local read control line WLR extending along the X-direction. Accordingly, the OTP cells 125 may be arranged in AND configuration.

Figure 5A:
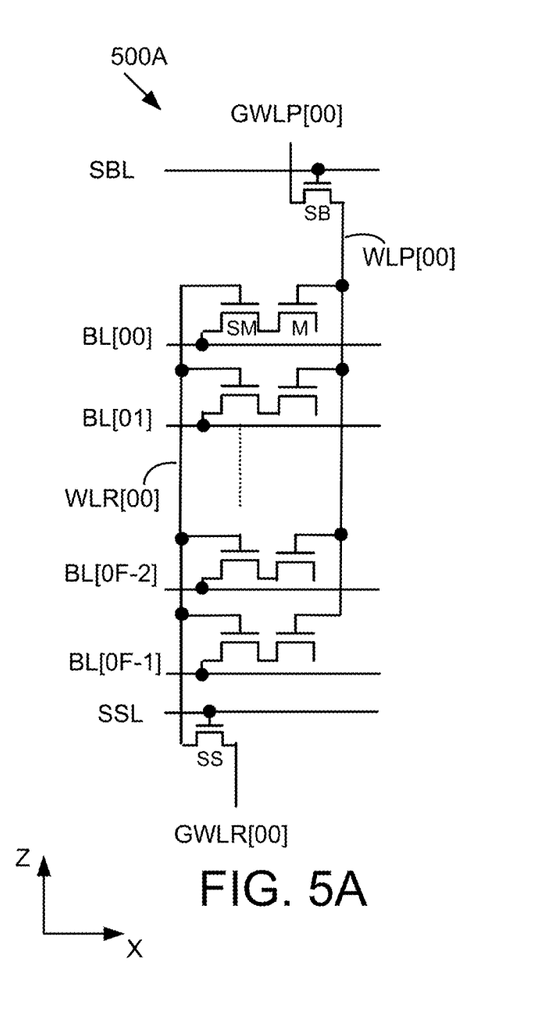
FIG. 5A is a diagram showing a first switch connected to a program control line of a subset of OTP cells and a second switch connected to a read control line of the subset of OTP cells, in accordance with one embodiment.

FIG. 5A is a diagram showing a portion 500A of the memory array 210 including a first switch SB connected to a local program control line WLP and a second switch SS connected to a local read control line WLR of a subset 310 of OTP cells, in accordance with one embodiment. The switches SB, SS may be embodied as transistors (e.g., MOSFET, GAAFET, FinFET, etc.). The switch SB may be embodied as an N-type transistor or a P-type transistor, and the switch SS may be embodied as an N-type transistor or a P-type transistor. In some embodiments, the switches SB, SS are implemented as same type of transistors or different types of transistors. For example, the switch SB may have a lower threshold voltage than the switch SS. The memory controller 105 (e.g., gate line controller 114) may simultaneously enable or disable the switches SS, SB to configure or operate one or more OTP cells 125 of the subset 310 of OTP cells.

In one configuration, the switch SB includes a first electrode (e.g., drain electrode) connected to the global program control line GWLP, a second electrode (e.g., source electrode) connected to the local program control line WLP, and a third electrode (e.g., gate electrode) connected to a corresponding switch control line SBL. The switch control line SBL may be a metal rail extending along the X-direction to connect the memory controller 105 (e.g., gate line controller 114) to the gate electrodes of switches SB. According to a voltage or a signal applied through the switch control line SBL, one or more switches SB connected to the switch control line SBL may be enabled or disabled. For example, in response to a voltage corresponding to logic state '1' provided through the switch control line SBL, a switch SB may be enabled to electrically couple the local program control line WLP to the global program control line GWLP. For example, in response to a voltage corresponding to logic state '0' provided through the switch control line SBL, the switch SB may be disabled to electrically decouple the local program control line WLP from the global program control line GWLP.

In one configuration, the switch SS includes a first electrode (e.g., source electrode) connected to the global read control line GWLR, a second electrode (e.g., drain electrode) connected to the local read control line WLR, and a third electrode (e.g., gate electrode) connected to a corresponding switch control line SSL. The switch control line SSL may be a metal rail extending along the X-direction to connect the memory controller 105 (e.g., gate line controller 114) to the gate electrodes of switches SS. According to a voltage or a signal applied through the switch control line SSL, one or more switches SS connected to the switch control line SSL may be enabled or disabled. For example, in response to a voltage corresponding to logic state '1' provided through the switch control line SSL, a switch SS may be enabled to electrically couple the local read control line WLR to the global read control line GWLR. For example, in response to a voltage corresponding to logic state '0' provided through the switch control line SSL, the switch SS may be disabled to electrically decouple the local read control line WLR from the global read control line GWLR.

Figure 5B:
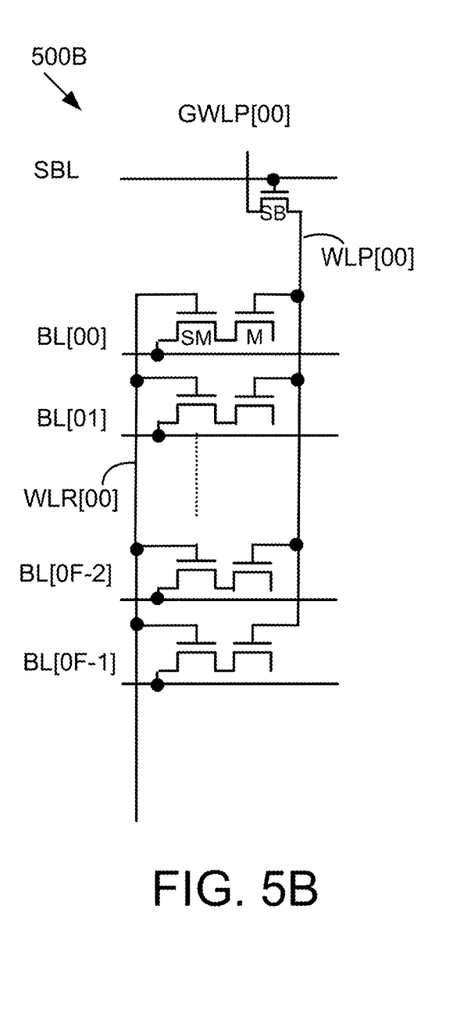
FIG. 5B is a diagram showing a switch connected to a program control line of a subset of OTP cells, in accordance with one embodiment.
Figure 5C:
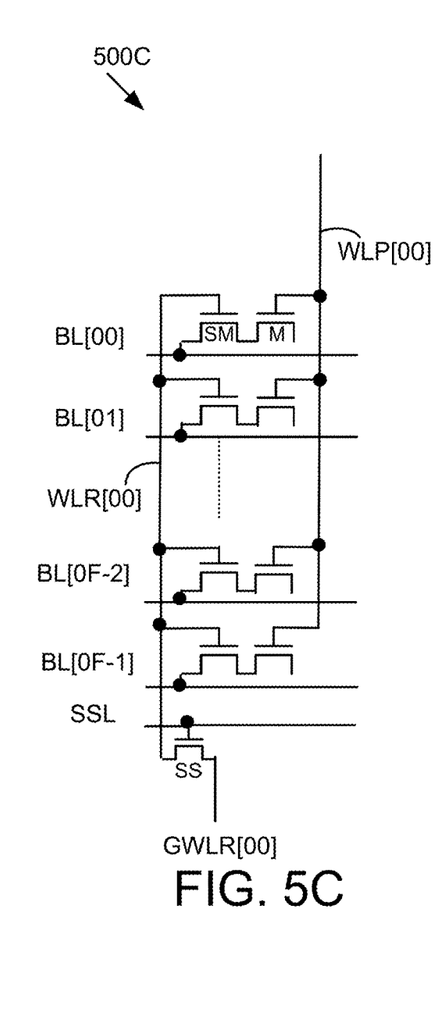
FIG. 5C is a diagram showing a switch connected to a read control line of a subset of OTP cells, in accordance with one embodiment.

In some embodiments, the subset 310 of OTP cells is connected to one of the switches SB, SS, while the other of the switches SB, SS is omitted. For example, in a portion 500B of the memory array 210 as shown in FIG. 5B, the switch SB is connected between the local program control line WLP and the global program control line GWLP and the switch SS is omitted. For example, in a portion 500C of the memory array 210 as shown in FIG. 5C, the switch SS is connected between the local read control line WLR and the global read control line GWLR and the switch SB is omitted. In one aspect, each switch may have a parasitic resistance, which may result in reduced operating speed or increased power consumption. By omitting one of the switches SB, SS as shown in FIG. 5B or FIG. 5C, parasitic resistance can be reduced to improve operating speed or improve power efficiency.

Figure 6:
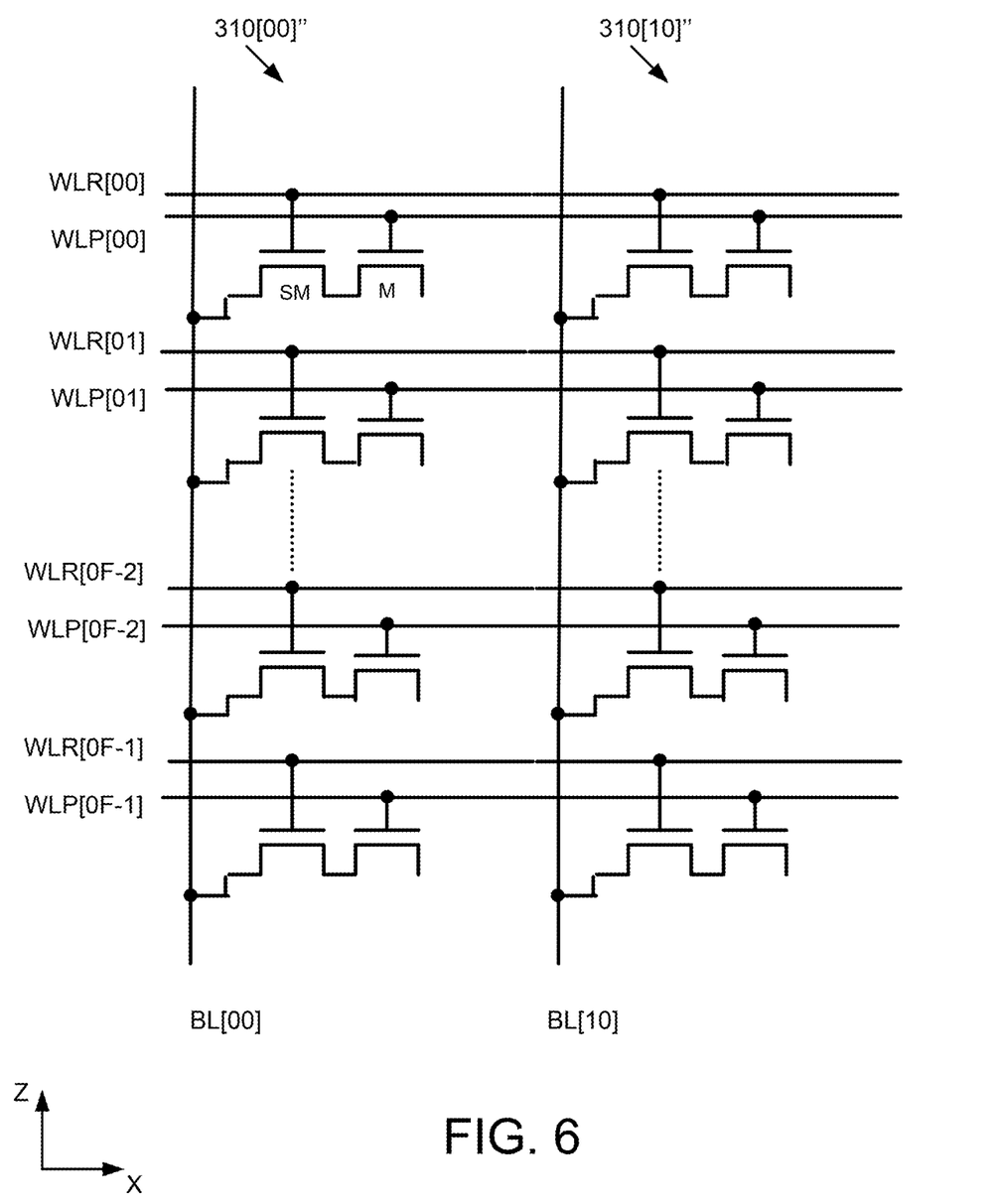
FIG. 6 is a diagram showing OTP cells, in accordance with one embodiment.

FIG. 6 is a diagram showing a subset 310[00]" of OTP cells and a subset 310[10]" of OTP cells, in accordance with one embodiment. In one configuration, gate electrodes of programmable storage devices M in the subset 310[00]" may be electrically coupled to gate electrodes of programmable storage devices M in the subset 310[10]" through respective local program control lines WLP extending along the X-direction. Similarly, gate electrodes of switches SM in the subset 310[00]" may be electrically coupled to gate electrodes of switches SM in the subset 310[10]" through respective local read control lines WLR extending along the X-direction. In one configuration, source electrodes of the switches SM of the subset 310[00]" are connected to a local bit line BL[00] extending along the Z-direction, and source electrodes of the switches SM of the subset 310[10]" are connected to a local bit line BL[10] extending along the Z-direction. Accordingly, the local program control lines WLP and the local read control lines WLR may extend along the X-direction in parallel.

Figure 7:
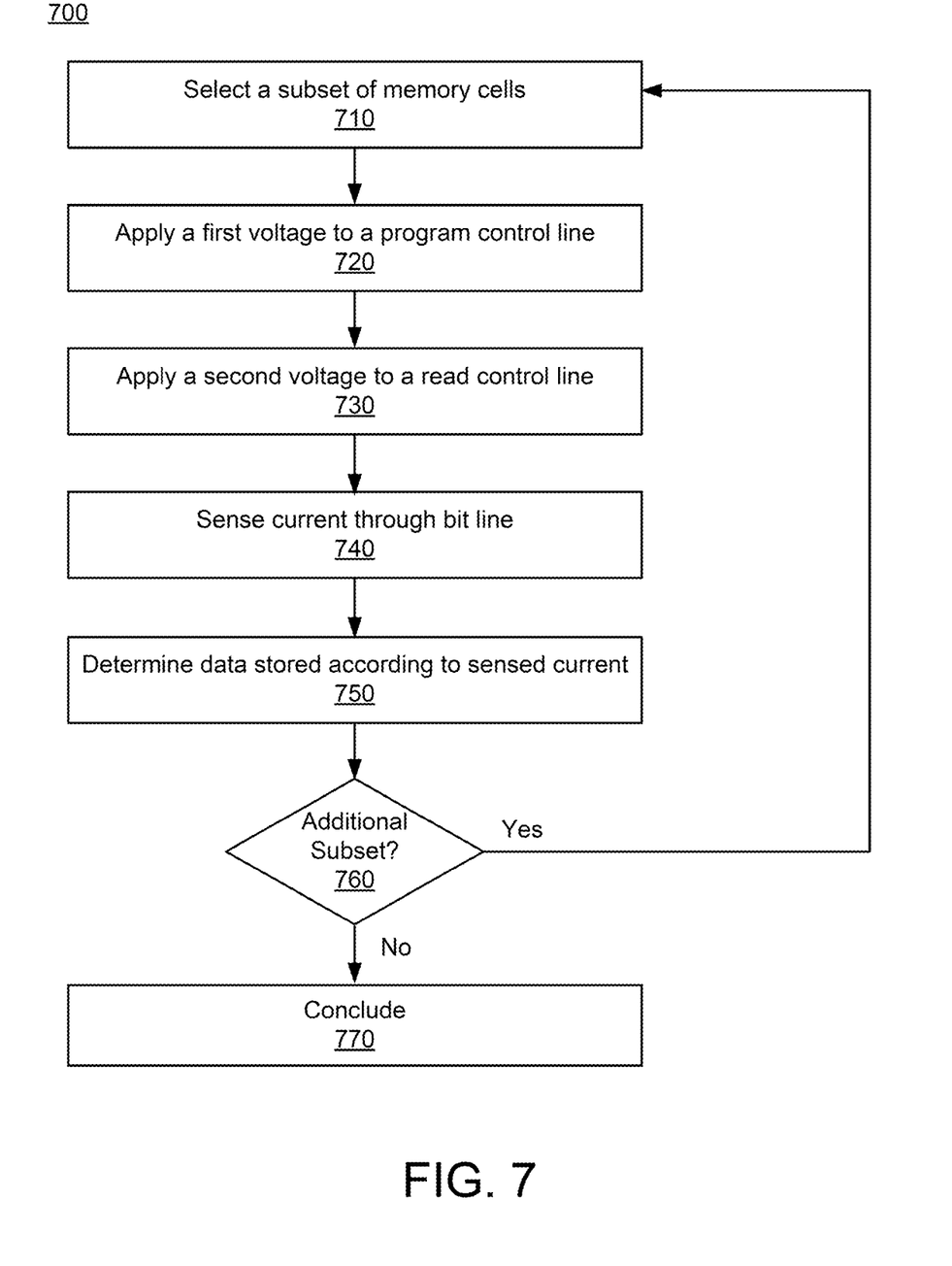
FIG. 7 is a flowchart showing a method of reading data stored by OTP cells, in accordance with some embodiments.

FIG. 7 is a flowchart showing a method 700 of reading data stored by OTP cells (e.g., OTP cell 125), in accordance with some embodiments. The method 700 may be performed by the memory controller 105 of FIG. 1. In some embodiments, the method 700 is performed by other entities. In some embodiments, the method 700 includes more, fewer, or different operations than shown in FIG. 7.

In an operation 710, the memory controller 105 selects a subset 310 of memory cells from a set of memory cells. Each memory cell may be an OTP cell. Each OTP cell 125 may include one or more switches SM and a programmable storage device M. Each programmable storage device M may be embodied as a non-volatile memory device (e.g., a flash memory device, resistive random access memory (ReRAM), magnetoresistive random-access memory (MRAM), phase change random access memory (PCRAM), etc.). Each programmable storage device M may be embodied as a transistor (e.g., MOSFET, GAAFET, FinFET, etc.). In one aspect, the subset of memory cells are connected between a local program control line WLP and a local read control line WLR in parallel. The local program control line WLP may extend along a first direction (e.g., Z-direction) towards a first side (e.g., top side) of the memory array 210, and the local read control line WLR may extend along the opposite direction of the first direction towards a second side (e.g., bottom side) of the memory array 210 facing away from the first side.

In an operation 720, the memory controller 105 applies a first voltage (e.g., 1V) to a local program control line WLP coupled to the selected subset 310 of OTP cells during a first time period. In an operation 730, the memory controller 105 applies a second voltage (e.g., corresponding logic '1') to a local read control line WLR coupled to the selected subset 310 of OTP cells during the first time period. According to the second voltage applied to the local read control line WLR, switches SM in the selected subset 310 of the OTP cells may be enabled to couple bit lines BL to programmable storage devices M of the selected subset 310 of OTP cells. By applying the first voltage to the local program control line WLP, current may flow through the selected subset 310 of OTP cells through the bit lines BL.

In an operation 740, the memory controller 105 may sense the current through the bit line BL coupled to the selected subset 310 of OTP cells during the first time period, in response to the first voltage applied to the local program control line WLP and the second voltage applied to the local read control line WLR. In an operation 750, the memory controller 105 may determine data stored by the selected subset 310 of OTP cells, according to the sensed current. For example, in response to the sensed current through a bit line BL coupled to an OTP cell 125 being above a predetermined threshold, the memory controller 105 may determine that the OTP cell 125 stores a first state. For example, in response to the sensed current through a bit line BL coupled to an OTP cell 125 being below a predetermined threshold, the memory controller 105 may determine that the OTP cell 125 stores a second state.

In the operation 760, the memory controller 105 determines whether an additional subset of memory cells to configure exists or not. An additional subset of memory cells may be disposed above the subset of memory cells along the Y-direction. If an additional subset exists, the memory controller 105 may proceed to the operation 710 and select a subsequent subset of memory cells during a second time period. In some embodiments, the memory controller 105 may select another set of memory cells and may proceed to the operation 710 for the another set of memory cells. The another set of memory cells may be stacked or disposed above the set of memory cells along the X-direction. If no additional set of memory cells exists, the memory controller 105 may conclude the method 700 in an operation 770.

Figure 8:
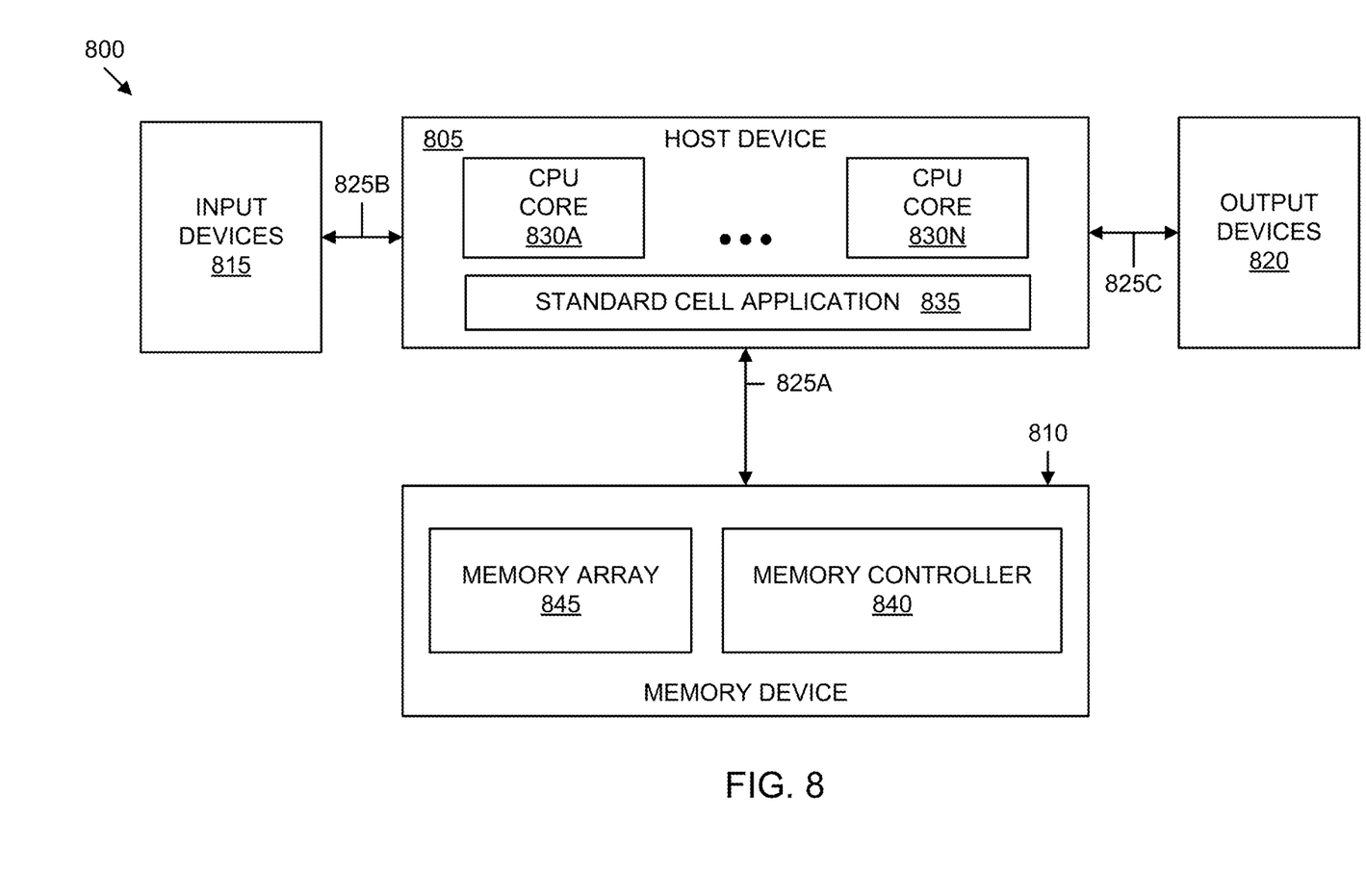
FIG. 8 is an example block diagram of a computing system, in accordance with some embodiments.

Referring now to FIG. 8, an example block diagram of a computing system 800 is shown, in accordance with some embodiments of the disclosure. The computing system 800 may be used by a circuit or layout designer for integrated circuit design. A "circuit" as used herein is an interconnection of electrical components such as resistors, transistors, switches, batteries, inductors, or other types of semiconductor devices configured for implementing a desired functionality. The computing system 800 includes a host device 805 associated with a memory device 810. The host device 805 may be configured to receive input from one or more input devices 815 and provide output to one or more output devices 820. The host device 805 may be configured to communicate with the memory device 810, the input devices 815, and the output devices 820 via appropriate interfaces 825A, 825B, and 825C, respectively. The computing system 800 may be implemented in a variety of computing devices such as computers (e.g., desktop, laptop, servers, data centers, etc.), tablets, personal digital assistants, mobile devices, other handheld or portable devices, or any other computing unit suitable for performing schematic design and/or layout design using the host device 805.

The input devices 815 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 805 and that allows an external source, such as a user (e.g., a circuit or layout designer), to enter information (e.g., data) into the host device and send instructions to the host device. Similarly, the output devices 820 may include a variety of output technologies such as external memories, printers, speakers, displays, microphones, light emitting diodes, headphones, video devices, and any other output peripherals that are configured to receive information (e.g., data) from the host device 805. The "data" that is either input into the host device 805 and/or output from the host device may include any of a variety of textual data, circuit data, signal data, semiconductor device data, graphical data, combinations thereof, or other types of analog and/or digital data that is suitable for processing using the computing system 800.

The host device 805 includes or is associated with one or more processing units/processors, such as Central Processing Unit ("CPU") cores 830A-830N. The CPU cores 830A-830N may be implemented as an Application Specific Integrated Circuit ("ASIC"), Field Programmable Gate Array ("FPGA"), or any other type of processing unit. Each of the CPU cores 830A-830N may be configured to execute instructions for running one or more applications of the host device 805. In some embodiments, the instructions and data to run the one or more applications may be stored within the memory device 810. The host device 805 may also be configured to store the results of running the one or more applications within the memory device 810. Thus, the host device 805 may be configured to request the memory device 810 to perform a variety of operations. For example, the host device 805 may request the memory device 810 to read data, write data, update or delete data, and/or perform management or other operations. One such application that the host device 805 may be configured to run may be a standard cell application 835. The standard cell application 835 may be part of a computer aided design or electronic design automation software suite that may be used by a user of the host device 805 to use, create, or modify a standard cell of a circuit. In some embodiments, the instructions to execute or run the standard cell application 835 may be stored within the memory device 810. The standard cell application 835 may be executed by one or more of the CPU cores 830A-830N using the instructions associated with the standard cell application from the memory device 810. In one example, the standard cell application 835 allows a user to utilize pre-generated schematic and/or layout designs of the memory system 100 or a portion of the memory system 100 to aid integrated circuit design. After the layout design of the integrated circuit is complete, multiples of the integrated circuit, for example, including the memory system 100 or a portion of the memory system 100 can be fabricated according to the layout design by a fabrication facility.

Referring still to FIG. 8, the memory device 810 includes a memory controller 840 that is configured to read data from or write data to a memory array 845. The memory array 845 may include a variety of volatile and/or non-volatile memories. For example, in some embodiments, the memory array 845 may include NAND flash memory cores. In other embodiments, the memory array 845 may include NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. The memories within the memory array 845 may be individually and independently controlled by the memory controller 840. In other words, the memory controller 840 may be configured to communicate with each memory within the memory array 845 individually and independently. By communicating with the memory array 845, the memory controller 840 may be configured to read data from or write data to the memory array in response to instructions received from the host device 805. Although shown as being part of the memory device 810, in some embodiments, the memory controller 840 may be part of the host device 805 or part of another component of the computing system 800 and associated with the memory device. The memory controller 840 may be implemented as a logic circuit in either software, hardware, firmware, or combination thereof to perform the functions described herein. For example, in some embodiments, the memory controller 840 may be configured to retrieve the instructions associated with the standard cell application 835 stored in the memory array 845 of the memory device 810 upon receiving a request from the host device 805.

It is to be understood that only some components of the computing system 800 are shown and described in FIG. 8. However, the computing system 800 may include other components such as various batteries and power sources, networking interfaces, routers, switches, external memory systems, controllers, etc. Generally speaking, the computing system 800 may include any of a variety of hardware, software, and/or firmware components that are needed or considered desirable in performing the functions described herein. Similarly, the host device 805, the input devices 815, the output devices 820, and the memory device 810 including the memory controller 840 and the memory array 845 may include other hardware, software, and/or firmware components that are considered necessary or desirable in performing the functions described herein.

One aspect of this description relates to a memory array. In some embodiments, the memory array includes a first set of one-time programmable (OTP) cells including a first subset of OTP cells connected between a first program control line and a first read control line. In some embodiments, each OTP cell of the first subset of OTP cells includes a programmable storage device and a switch connected between the first program control line and the first read control line. In some embodiments, the first program control line extends towards a first side of the memory array along a first direction. In some embodiments, the first read control line extends towards a second side of the memory array facing away from the first side of the memory array.

One aspect of this description relates to a memory array. In some embodiments, the memory array includes a first set of OTP cells connected between a first program control line and a first bit line. In some embodiments, each OTP cell of the first set of OTP cells includes a programmable storage device and a switch connected between the first program control line and the first bit line. In some embodiments, the first program control line extends towards a first side of the memory array along a first direction. In some embodiments, the first bit line extends towards a second side of the memory array facing away from the first side of the memory array. In some embodiments, the memory array includes a second set of OTP cells connected between a second program control line and a second bit line. In some embodiments, each OTP cell of the second set of OTP cells includes a programmable storage device and a switch connected between the second program control line and the second bit line. In some embodiments, the second program control line extends towards the first side of the memory array. In some embodiments, the second bit line extends towards the second side of the memory array. In some embodiments, each switch of the first set of OTP cells includes a gate electrode coupled to a gate electrode of a corresponding switch of the second set of OTP cells through a corresponding read control line extending along a second direction traversing the first direction.

One aspect of this description relates to a method of reading data stored by a memory array. In some embodiments, the method includes applying, by a controller during a first time period, a first voltage to a first program control line. In some embodiments, a first subset of OTP cells is connected between the first program control line and a first read control line in parallel. In some embodiments, each OTP cell of the first subset of OTP cells includes a programmable storage device and a switch connected between the first program control line and the first read control line. In some embodiments, the first program control line extends towards a first side of a memory array along a first direction. In some embodiments, the first read control line extends towards a second side of the memory array facing away from the first side of the memory array. In some embodiments, each switch includes a source electrode connected to a corresponding bit line extending along a second direction. In some embodiments, the method includes applying, by the controller during the first time period, a second voltage to the first read control line. In some embodiments, the method includes sensing, by the controller during the first time period, for each OTP cell of the first subset of OTP cells, current through the corresponding bit line, in response to the first voltage applied to the first program control line and the second voltage applied to the first read control line. In some embodiments, the method includes determining, by the controller, data stored by the first subset of OTP cells according to the sensed current.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory array comprising:
 a first set of one-time programmable (OTP) cells including:
  a first subset of OTP cells extending and connected between a first program control line and a first read control line, wherein each OTP cell of the first subset of OTP cells includes a programmable storage device and a switch extending and connected between the first program control line and the first read control line, wherein the first program control line extends towards a first side of the memory array along a first direction, wherein the first read control line extends towards a second side of the memory array facing away from the first side of the memory array,
 wherein the first set of OTP cells further includes:
  a second subset of OTP cells extending and connected between a second program control line and a second read control line, wherein each OTP cell of the second subset of OTP cells includes a programmable storage device and a switch extending and connected between the second program control line and the second read control line, wherein the second program control line extends towards the first side of the memory array along the first direction, wherein the second read control line extends towards the second side of the memory array, wherein the first program control line and the second program control line are coupled to a global program control line extending along a second direction traversing the first direction, and wherein the first read control line and the second read control line extend along the first direction and are coupled to a global read control line extending along the second direction.

2. The memory array of claim 1, wherein each programmable storage device is a first transistor including a gate electrode connected to the first program control line, and wherein each switch is a second transistor including a gate electrode connected to the first read control line.

3. The memory array of claim 2, wherein the first transistor is a first type of transistor, wherein the second transistor is a second type of transistor.

4. The memory array of claim 2, wherein the first transistor and the second transistor are same type of transistors.

5. The memory array of claim 2, wherein each programmable storage device includes a floating electrode.

6. The memory array of claim 1, further comprising:
a first switch connected between the first program control line and the global program control line; and
a second switch connected between the second program control line and the global program control line, wherein the global program control line extends along a second direction traversing the first direction.

7. The memory array of claim 6, wherein the first switch is a first transistor, and wherein the second switch is a second transistor.

8. The memory array of claim 6, further comprising:
a third switch connected between the first read control line and a global read control line; and
a fourth switch connected between the second read control line and the global read control line, wherein the global read control line extends along the second direction,
wherein the third switch and the fourth switch are closer to the second side of the memory array than the first switch and the second switch.

9. The memory array of claim 1, further comprising a second set of OTP cells, wherein the second set of OTP cells further includes a second subset of OTP cells connected between a second program control line and a second read control line, wherein each OTP cell of the second subset of OTP cells includes a programmable storage device and a switch connected between the second program control line and the second read control line, wherein the second program control line extends towards the first side of the memory array along the first direction, wherein the second read control line extends towards the second side of the memory array.

10. The memory array of claim 9, wherein each OTP cell of the first subset of OTP cells is connected to a corresponding OTP cell of the second subset of OTP cells through a corresponding bit line extending along a second direction traversing the first direction.

11. A method comprising:
applying, by a controller during a first time period, a first voltage to a first program control line, wherein a first subset of one-time programmable (OTP) cells is connected and extends between the first program control line and a first read control line, wherein each OTP cell of the first subset of OTP cells includes a programmable storage device and a switch connected and extending between the first program control line and the first read control line, wherein the first program control line extends towards a first side of a memory array along a first direction, wherein the first read control line extends towards a second side of the memory array facing away from the first side of the memory array, wherein each switch includes a source electrode connected to a corresponding bit line extending along a second direction;
applying, by the controller during the first time period, a second voltage to the first read control line;
sensing, by the controller during the first time period, for each OTP cell of the first subset of OTP cells, current through the corresponding bit line, in response to the first voltage applied to the first program control line and the second voltage applied to the first read control line; and
applying, by the controller during a second time period, the first voltage to a second program control line, wherein a second subset of OTP cells is connected and extends between the second program control line and a second read control line, wherein each OTP cell of the second subset of OTP cells includes a programmable storage device and a switch connected and extending between the second program control line and the second read control line, wherein the second program control line extends towards the first side of the memory array along the first direction, wherein the second read control line extends towards the second side of the memory array, wherein the first program control line and the second program control line are coupled to a global program control line extending along the second direction traversing the first direction, wherein each switch of the second subset of OTP cells includes a source electrode connected to the corresponding bit line extending along the second direction, and wherein the first read control line and the second read control line extend along the first direction and are coupled to a global read control line extending along the second direction.

12. The method of claim 11, further comprising:
determining, by the controller, data stored by the first subset of OTP cells according to the sensed current.

13. The method of claim 11, further comprising:
applying, by the controller during the second time period, the second voltage to the second read control line; and
sensing, by the controller during the second time period, for each OTP cell of the second subset of OTP cells, current through the corresponding bit line, in response to the first voltage applied to the second program control line and the second voltage applied to the second read control line.

14. A memory array comprising:
a first set of one-time programmable (OTP) cells including:
a first subset of OTP cells extending and connected between a first program control line and a first read control line, wherein the first program control line extends towards a first side of the memory array along a first direction, wherein the first read control line extends towards a second side of the memory array facing away from the first side of the memory array; and
a second subset of OTP cells extending and connected between a second program control line and a second read control line, wherein the first read control line and the second read control line extend along the first direction and are coupled to a global read control line extending along the second direction.

15. The memory array of claim 14, wherein the first program control line and the second program control line are coupled to a global program control line extending along a second direction traversing the first direction.

16. The memory array of claim 14, wherein each OTP cell of the first subset of OTP cells includes a programmable storage device and a switch extending and connected between the first program control line and the first read control line.

17. The memory array of claim 16, wherein each OTP cell of the second subset of OTP cells includes a programmable storage device and a switch extending and connected between the second program control line and the second read control line.

18. The memory array of claim 17, wherein the second program control line extends towards the first side of the memory array along the first direction.

19. The memory array of claim 18, wherein the second read control line extends towards the second side of the memory array.

20. The memory array of claim 16, wherein the programmable storage device is a first transistor including a gate electrode connected to the first program control line.

\* \* \* \* \*